United States Patent
Lenka et al.

(10) Patent No.: US 9,575,123 B2
(45) Date of Patent: Feb. 21, 2017

(54) REGISTERS FOR POST CONFIGURATION TESTING OF PROGRAMMABLE LOGIC DEVICES

(71) Applicant: Lattice Semiconductor Corporation, Hillsboro, OR (US)

(72) Inventors: Pradeep Lenka, Milpitas, CA (US); Kyoho Lee, Pleasanton, CA (US); Andrew Lin, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 92 days.

(21) Appl. No.: 14/604,515

(22) Filed: Jan. 23, 2015

(65) Prior Publication Data

US 2016/0216330 A1  Jul. 28, 2016

(51) Int. Cl.
*G01R 31/28* (2006.01)
*G01R 31/3185* (2006.01)

(52) U.S. Cl.
CPC .............................. *G01R 31/318516* (2013.01)

(58) Field of Classification Search
CPC ...................... G01R 31/3177; G01R 31/31705; G01R 31/318555; G01R 31/318516; G06F 11/25; G06F 17/5027; G06F 11/3636; G06F 11/3656; G06F 11/27; G11C 29/16; G11C 8/16; G11C 2029/0401; H03K 19/17712
See application file for complete search history.

(56) References Cited

U.S. PATENT DOCUMENTS

| | | | | |
|---|---|---|---|---|
| 4,940,909 A | * | 7/1990 | Mulder | H03K 19/17712 326/38 |
| 5,570,375 A | * | 10/1996 | Tsai | G01R 31/31854 714/30 |
| 6,297,757 B1 | * | 10/2001 | Campbell, Jr. | H03M 1/108 341/118 |
| 6,961,884 B1 | * | 11/2005 | Draper | G01R 31/31855 714/724 |
| 7,475,315 B1 | * | 1/2009 | Natarajan | G11C 29/16 326/37 |
| 7,536,615 B1 | | 5/2009 | Pierce et al. | |
| 7,743,296 B1 | | 6/2010 | Pierce et al. | |
| 2001/0037477 A1 | * | 11/2001 | Veenstra | G01R 31/3177 714/41 |
| 2013/0179741 A1 | * | 7/2013 | Sinykin | G06F 17/5045 714/724 |

OTHER PUBLICATIONS

Lattice Semiconductor Corporation, "Lattice Diamond Tutorial", http://help.latticesemi.com/docs/tutorial/fpga_design_tutor.pdf, Apr. 2013, pp. 1-58.

* cited by examiner

*Primary Examiner* — Guerrier Merant
(74) *Attorney, Agent, or Firm* — Haynes and Boone, LLP

(57) ABSTRACT

Various techniques are provided to implement user specified test registers locally on a PLD for use while the PLD is configured with a user design and tested. In one example, a machine-implemented method includes receiving, from an external test application, a data value at a programmable logic device (PLD) running configured user logic. The method also includes writing the data value into a test register of the PLD. The method also includes providing a control signal from the test register to the configured user logic in response to the data value. The method also includes switching operation of the configured user logic from a first test implementation to a second test implementation in response to the control signal.

18 Claims, 4 Drawing Sheets

REGISTERS FOR POST CONFIGURATION TESTING OF PROGRAMMABLE LOGIC DEVICES

TECHNICAL FIELD

The present invention relates generally to programmable logic devices and, more particularly, to the testing of user designs implemented in such devices.

BACKGROUND

Programmable logic devices (PLDs) (e.g., field programmable gate arrays (FPGAs), complex programmable logic devices (CPLDs), field programmable system on a chips (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other resources) and interconnections available in particular PLDs. Physical placement and routing for the synthesized and mapped user designs are then determined to generate configuration data for the particular PLDs.

After being programmed with the configuration data, the PLD may be tested. In some cases, a user design may include several alternative implementations of particular functionality, and a user may wish to switch between the different implementations during testing without having to completely reconfigure the PLD.

Conventionally, such switching is performed using hardware DIP switches on a test board. While the PLD is connected to the test board, the DIP switches are connected to corresponding physical pins of the PLD. To switch between different implementations, a user physically adjusts one or more DIP switches to provide corresponding switched signals to the PLD through the physical pins.

Also during testing, a user may wish to monitor various signals of the PLD. Conventional approaches rely on lights (e.g., light emitting diodes) also provided on the test board. Particular lights are connected to additional corresponding physical pins of the PLD to receive monitored PLD signals routed to the physical pins. For example, a logic high or logic low signal value may be indicated by illuminating or dimming the corresponding light.

Unfortunately, such conventional testing and monitoring procedures rely on limited physical resources of the PLD and test board (e.g., limited numbers of pins, DIP switches, and/or lights). As a result, only a small number of alternative implementations may be tested (e.g., using 8 or fewer DIP switches) and only a small number of signals may be monitored (e.g., using 12 or fewer LEDs). Moreover, such arrangements require physical interaction by the user to adjust the DIP switches and view the lights. As a result, it can be difficult to properly test and monitor complex user designs employing large numbers of alternative implementations and/or monitored signals.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

In accordance with embodiments set forth herein, techniques are provided to implement user specified test registers locally on a PLD for use while the PLD is configured with a user design and tested. In some embodiments, software running on an external system may selectively write data values to the test registers while the PLD is configured and running a user design. The register data values may be routed as control signals to selectively adjust the realtime operation of the user design. For example, particular data values may be routed as control signals to multiplexers, switching logic, and/or other portions of user configured logic to select between multiple alternative implementations of particular functionality (e.g., to selectively enable or disable particular types of counters configured in the PLD, trigger the generation of various data packets within the PLD for use as test vectors during PLD testing, provide various data values for calculations performed by the PLD, and/or other appropriate functionality).

In some embodiments, signals from within the PLD may be routed and written to the test registers. The register data values may be routed back out of the PLD to the external system for realtime monitoring of internal PLD operations.

In some embodiments, the PLD may be configured with a debug core in addition to the user design. In this regard, the debug core may interface between the test registers of the PLD and one or more communication ports (e.g., one or more input/output ports) connected to the external system. As a result, the external system may interact with the test registers through the debug core. After testing is complete and the final user design is approved, the debug core and corresponding test registers may be removed from the PLD configuration.

Figure 1:
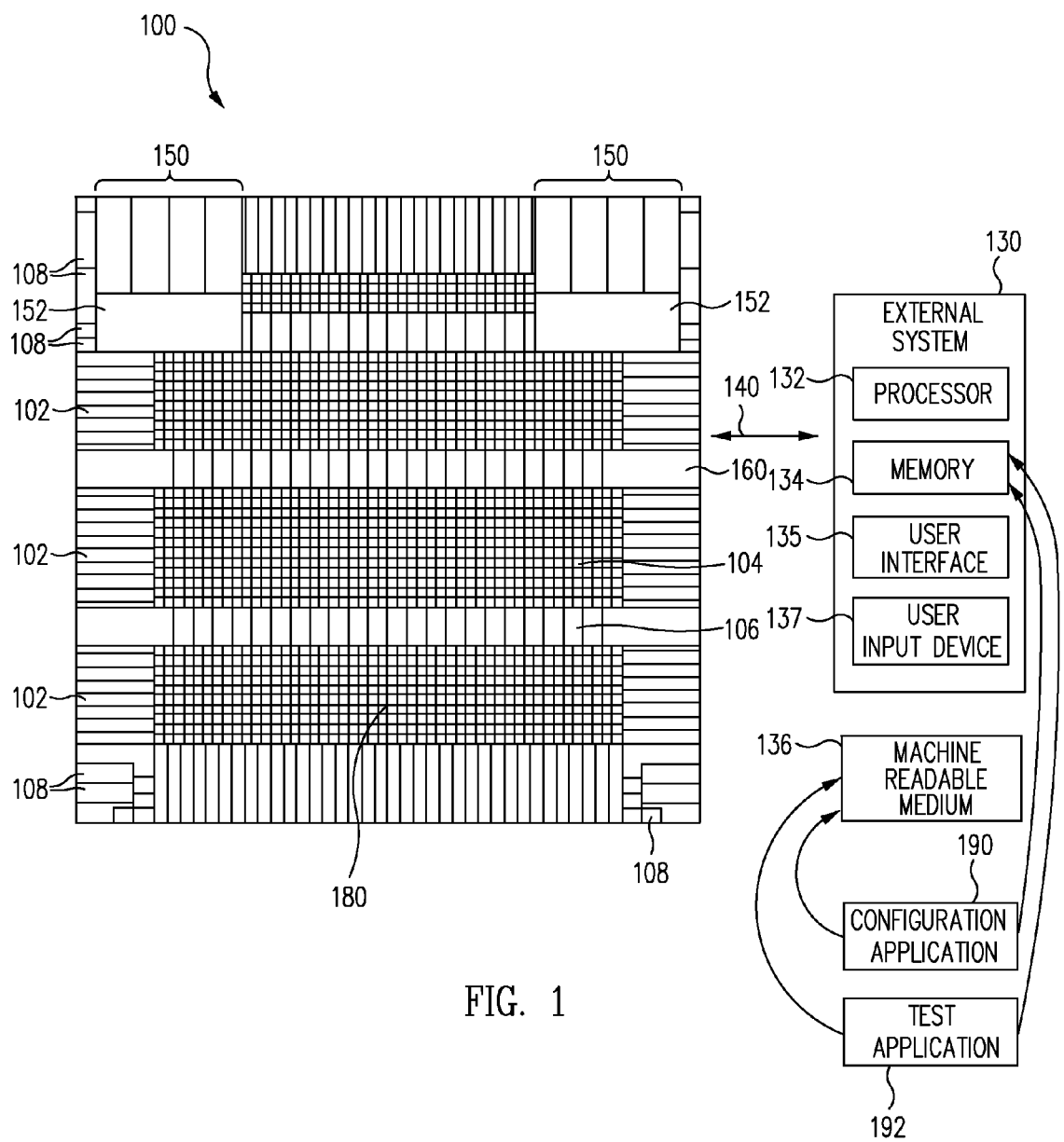
FIG. 1 illustrates a block diagram of a programmable logic device (PLD) in accordance with an embodiment of the disclosure.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. In various embodiments, I/O blocks 102 and SERDES blocks 150 may route signals to and from associated external ports (e.g., physical pins) of PLD 100. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, I/O blocks 102 may be used for programming PLD 100, such as memory 106 or transferring information (e.g., various types of data and/or control signals) to/from PLD 100 through various external ports as would be understood by one skilled in the art. I/O blocks 102 may provide a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). I/O blocks 102 typically, for example, may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources 180 to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 (e.g., also referred to as an external device) may be used to create a desired user configuration or design of PLD 100, generate corresponding configuration data to program (e.g., configure) PLD 100, and test the operation of the configured PLD 100. For example, system 130 may provide such configuration data to one or more I/O blocks 102, SERDES blocks 150, and/or other portions of PLD 100. As a result, programmable logic blocks 104, routing resources 180, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine-readable mediums 136 (e.g., a memory or other appropriate storage medium internal or external to system 130). For example, in some embodiments, system 130 may run a PLD configuration application 190, such as Lattice Diamond System Planner software available from Lattice Semiconductor Corporation to permit a user to create a desired configuration and generate corresponding configuration data to program PLD 100. In some embodiments, system 130 may run a test application 192 (e.g., also referred to as a debugging application), such as Lattice Reveal software available from Lattice Semiconductor Corporation to evaluate the operation of PLD 100 after it has been configured.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100 and/or to identify various triggers used to evaluate the operation of PLD 100, as further described herein.

Figure 2:
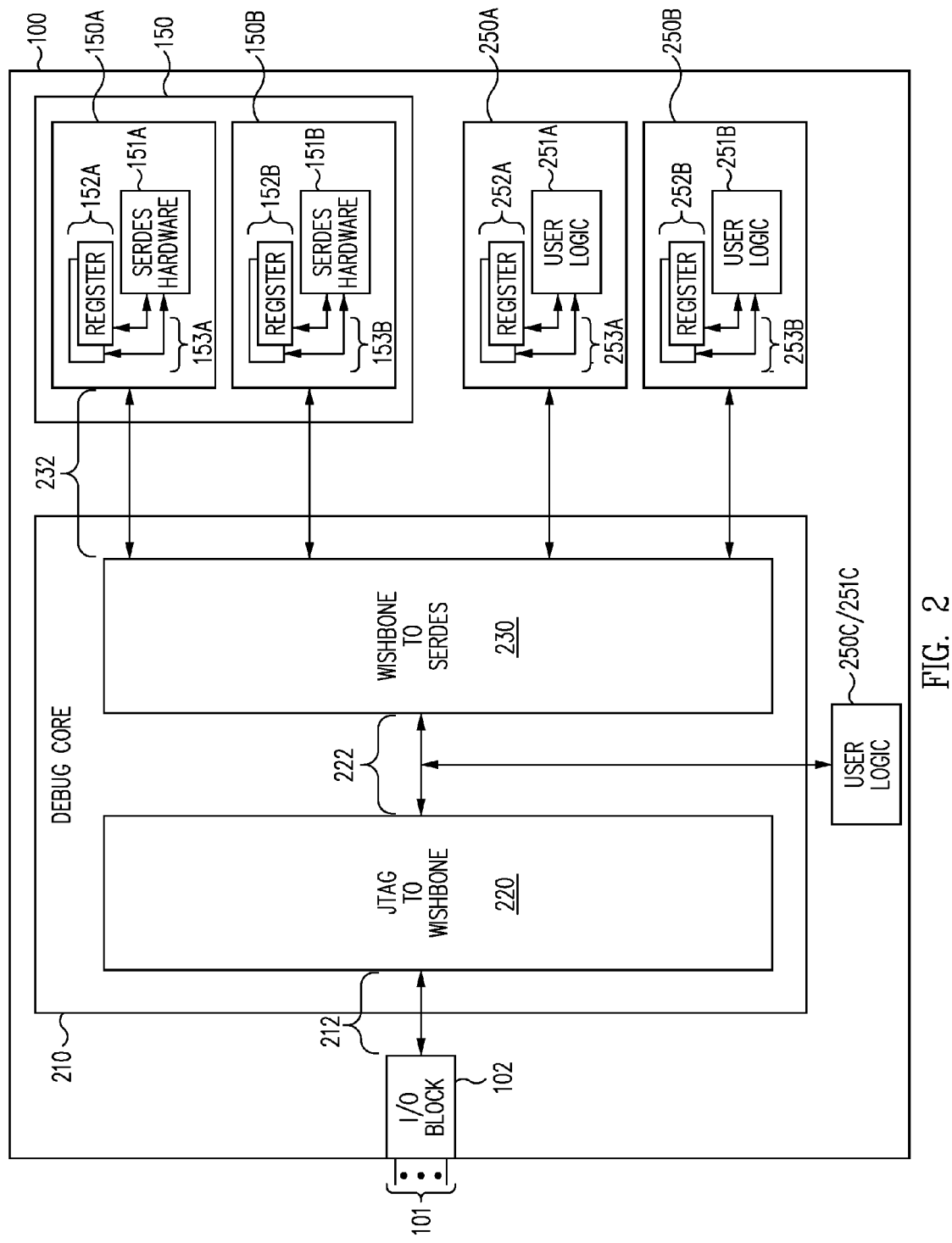
FIG. 2 illustrates a block diagram of a portion of a PLD providing onboard user controllable test registers in accordance with an embodiment of the disclosure.

FIG. 2 illustrates a block diagram of a portion of PLD 100 providing onboard user controllable test registers 252 (e.g., labeled in groups 252A and 252B) in accordance with an embodiment of the disclosure. In FIG. 2, PLD 100 has been configured to implement a debug core 210 and a user design 250 (e.g., labeled as portions 250A-C). As further discussed herein, external system 130 receives information specifying debug core 210 and user design 250. External system 130 generates appropriate configuration data to implement debug core 210 and user design 250 in programmable logic blocks 104, memory 106, routing resources 180, and/or other resources of PLD 100 as appropriate. Thus, debug core 210 and user design 250 may be specified by software running on external system 130 which is used to configure PLD 100 accordingly for testing. FIG. 2 further illustrates an example hardware SERDES block 150 implemented by PLD 100.

Debug core 210 communicates with external system 130 through a JTAG port implemented by an I/O block 102. In this regard, JTAG commands are passed between PLD 100 and external system 130 through one or more physical pins 101 of PLD 100 in communication with external system 130 and I/O block 102 (e.g., over connections 140 in FIG. 1).

Debug core 210 includes translation logic blocks 220 and 230 which convert between different command formats used by various signal busses in PLD 100. In this regard, translation logic block 220 converts between JTAG commands passed over a JTAG bus 212 and Wishbone commands passed over Wishbone buses 222. Translation logic block 230 converts between Wishbone commands passed over Wishbone buses 222 and register commands (e.g., SERDES commands in some embodiments) passed over register busses 232. As a result of the intermediate translation to Wishbone commands between translation logic blocks 220 and 230, user design portion 250C (e.g., implementing a Lattice Microsoft core microprocessor and/or other functionality) may communicate with external system 130 through debug core 210 using Wishbone commands.

User design 250 includes user logic 251 (e.g., soft logic implemented by configured programmable logic blocks 104) and test registers 252. In the illustrated embodiment, user design 250 is implemented with three logical portions denoted 250A-C, each of which is provided with corresponding user logic 251A-C. These representations are provided for convenience of discussion only. In actual practice, user design 250 may include numerous portions used to implement a variety of user-specified operations.

Test registers 252 send and/or receive signals 253 (e.g., labeled in groups 253A and 253B) to selectively adjust the operation of user logic 251 (e.g., in response to commands from external system 130) and/or to monitor the status of user logic 251 (e.g., to pass data values to external system 130). In some embodiments, test registers 252 may be implemented, for example, by memory 106 and/or routing resources 180 of PLD 100 in 8-bit format, 16-bit format, 32-bit format, or other formats.

In FIG. 2, user design portions 250A and 250B each include a group of test registers 251A and 251B in communication with user logic 251A and 251B through groups of corresponding signals 253A and 253B. Although two test registers 252 and two signals 253 are illustrated for each of user design portions 250A and 250B, and no test registers 252 or corresponding signals 253 are provided for user design portion 250C, these are merely examples. Any desired number of test registers 252 and/or signals 253 may be used for various portions of user design 250 in other embodiments.

SERDES block 150 includes SERDES sub-blocks 150A and 150B, each of which include respective SERDES hardware 151A and 151B to implement SERDES functionality. SERDES sub-blocks 150A and 150B each include a plurality of hardware registers 152A and 152B which send and/or receive a plurality of signals 153A and 153B to selectively adjust the operation of SERDES hardware 151A and 151B (e.g., in response to commands from external system 130) and/or to monitor the status of SERDES hardware 151A and 151B (e.g., to pass data values to external system 130). In some embodiments, hardware registers 152A-B may be implemented by corresponding hardware of SERDES block 150 itself in 8-bit format or other formats. Although two hardware registers 152 are illustrated for each SERDES sub-block 150A-B, any desired number of hardware registers may be used in other embodiments.

Thus, it will be appreciated that PLD 100 includes test registers 252A-B to adjust and/or monitor user logic 251A-B (e.g., soft logic), and further includes hardware registers 152A-B to adjust and/or monitor SERDES hardware 151A-B. All of these various registers may be selectively written to or read by external system 130 issuing appropriate commands (e.g., JTAG commands or otherwise) over I/O block 102.

Figure 3:
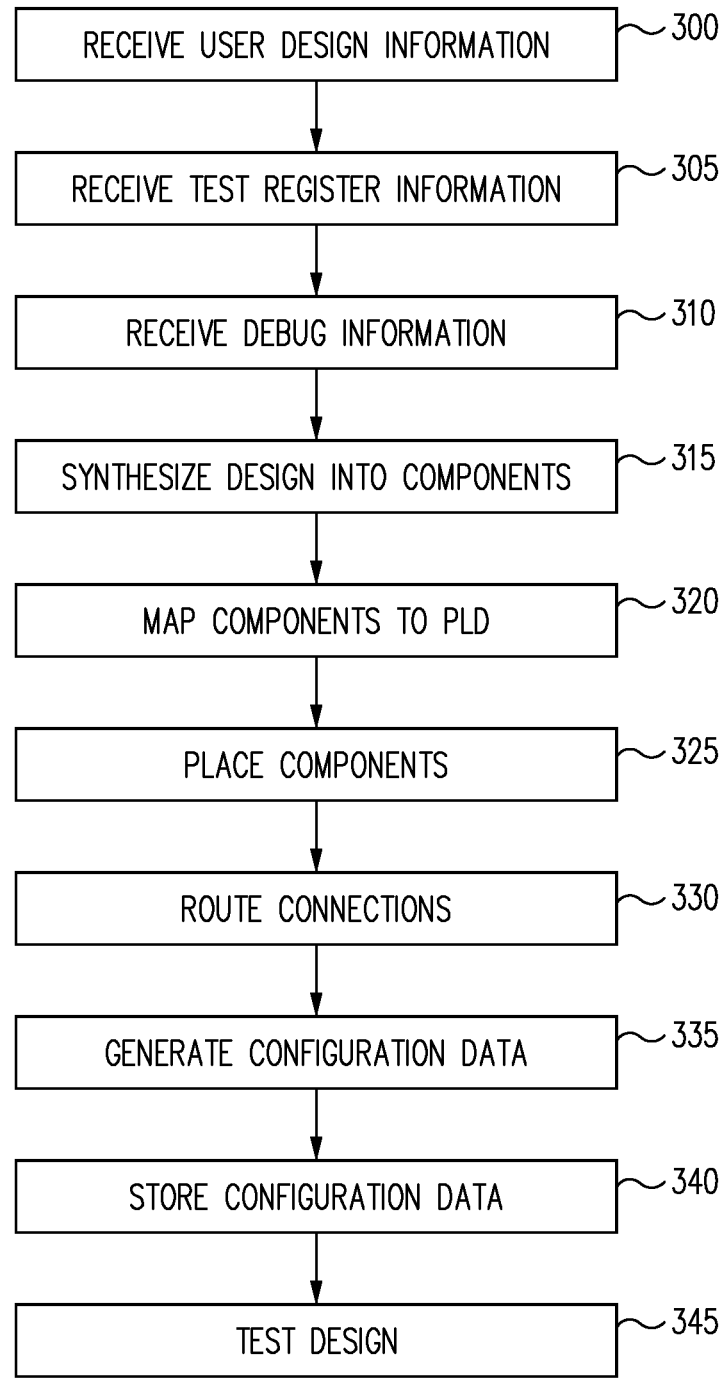
FIG. 3 illustrates a design process for a PLD in accordance with an embodiment of the disclosure.

FIG. 3 illustrates a design process for PLD 100 in accordance with an embodiment of the disclosure. For example, the process of FIG. 3 may be performed by system 130 running configuration application 190 and/or test application 192. In some embodiments, the various files and information referenced in FIG. 3 may be stored, for example, in one or more databases and/or other data structures in memory 134, machine-readable medium 136, and/or otherwise.

In operation 300, system 130 receives user design information that specifies the desired functionality of PLD 100. For example, the user may interact with system 130 (e.g., through user input device 137 and hardware description language (HDL) code representing the design) to identify various features of user design 250 (e.g., high level logic operations, hardware configurations, and/or other features). In some embodiments, user design 250 may be provided in a register transfer level (RTL) description (e.g., a gate level description). System 130 may perform one or more rule checks to confirm that user design 250 describes a valid configuration of PLD 100. For example, system 130 may reject invalid configurations and/or request the user to provide a new user design 250 as appropriate.

In operation 305, system 130 receives test register information (e.g., provided by a user or otherwise) to be added to user design 250. This information identifies one or more test registers 252, associated signals 253, and associated connections (e.g., implemented by routing resources 180) to user logic 251. In some embodiments, each test register 252 may be identified by a corresponding address used by system 130 to identify particular memory locations of PLD 100. In some embodiments, such addresses may be provided in hexadecimal format in a range from 1000 to 1FFF hex (e.g., from 4096 to 8191 decimal) for user design portion 250A and from 2000 to 2FFF hex (e.g., from 8192 to 12287 decimal) for user design portion 250B. Thus, it will be appreciated that thousands of test registers 252 may be provided and conveniently accessed by system 130.

In operation 310, system 130 receives debug information. In some embodiments, this may include a user instructing system 130 to implement debug core 210 as part of the overall configuration of PLD 100. For example, if user design 250 is being prepared for testing, then the user may choose to implement debug core 210. In some embodiments, operation 310 may include a user providing system 130 with instructions to execute one or more iterative processes (e.g., implemented as scripts or otherwise) identifying various data to be written to and/or read from one or more test registers 252 as part of a testing process, as further described herein.

In operation 315, system 130 synthesizes the overall design to be implemented by PLD 100 (e.g., including user design information received in operation 300, the test register information received in operation 305, and the debug information received in operation 310) to create a netlist (e.g., a synthesized RTL description) identifying an abstract logic implementation of the overall PLD design as a plurality of logic components (e.g., also referred to as netlist components). In some embodiments, the netlist may be stored in Electronic Design Interchange Format (EDIF) in a Native Generic Database (NGD) file.

In some embodiments, synthesizing the overall design into a netlist in operation 315 may involve converting (e.g., translating) the high-level description of logic operations, hardware configurations, and/or other features in the various received information into a set of PLD components (e.g., logic blocks 104 and other components of PLD 100 configured for logic, arithmetic, or other hardware functions to implement the design) and their associated interconnections or signals. Depending on embodiments, the converted design may be represented as a netlist.

In operation 320, system 130 performs a mapping process that identifies components of PLD 100 that may be used to implement the PLD design. In this regard, system 130 may map the netlist to various types of components provided by PLD 100 (e.g., logic blocks 104, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 220 to produce a netlist that is mapped to PLD components.

In operation 325, system 130 performs a placement process to assign the mapped netlist components to particular physical components residing at specific physical locations of the PLD 100 (e.g., assigned to particular logic blocks 104 and/or other physical components of PLD 100), and thus determine a layout for the PLD 100. In some embodiments, the placement may be performed on one or more previously-stored NCD files, with the placement results stored as another physical design file.

In operation 330, system 130 performs a routing process to route connections (e.g., using routing resources 180) among the components of PLD 100 based on the placement layout determined in operation 325 to realize the physical interconnections among the placed components. In some embodiments, the routing may be performed on one or more previously-stored NCD files, with the routing results stored as another physical design file.

Thus, following operation 330, one or more physical design files may be provided which specify the PLD design after it has been synthesized (e.g., converted and optimized), mapped, placed, and routed for PLD 100 (e.g., by combining the results of the corresponding previous operations). In operation 335, system 130 generates configuration data for the synthesized, mapped, placed, and routed PLD design.

In operation 340, the configuration data is stored for subsequent use by PLD 100. For example, in some embodiments, the configuration data is stored in a non-volatile memory (e.g., within PLD 100 itself or external to PLD 100 such as in machine-readable medium 136). When PLD 100 is started (e.g., powered on), the configuration data is loaded from the non-volatile memory into appropriate volatile memory of PLD 100 to configure PLD 100 for use. In other embodiments, the configuration data is stored by external system 130 and/or machine-readable medium 136 and loaded into appropriate volatile memory of PLD 100 when PLD is started.

In operation 345, the PLD design as implemented by the configuration data is tested as further described herein. After testing has been performed in operation 345, a user may choose to modify user design 250. In this case, the process of FIG. 3 may be repeated until user design 250 has been finalized (e.g., after all testing has been completed to the user's satisfaction). For the final PLD design, the process of FIG. 3 may be repeated, but with operations 310 and 345 omitted. In this regard, the final configuration of PLD 100 may include user design 250 without implementing test registers 252A-B and debug core 210, thus reducing the overall resources and complexity of the final PLD design.

Figure 4:
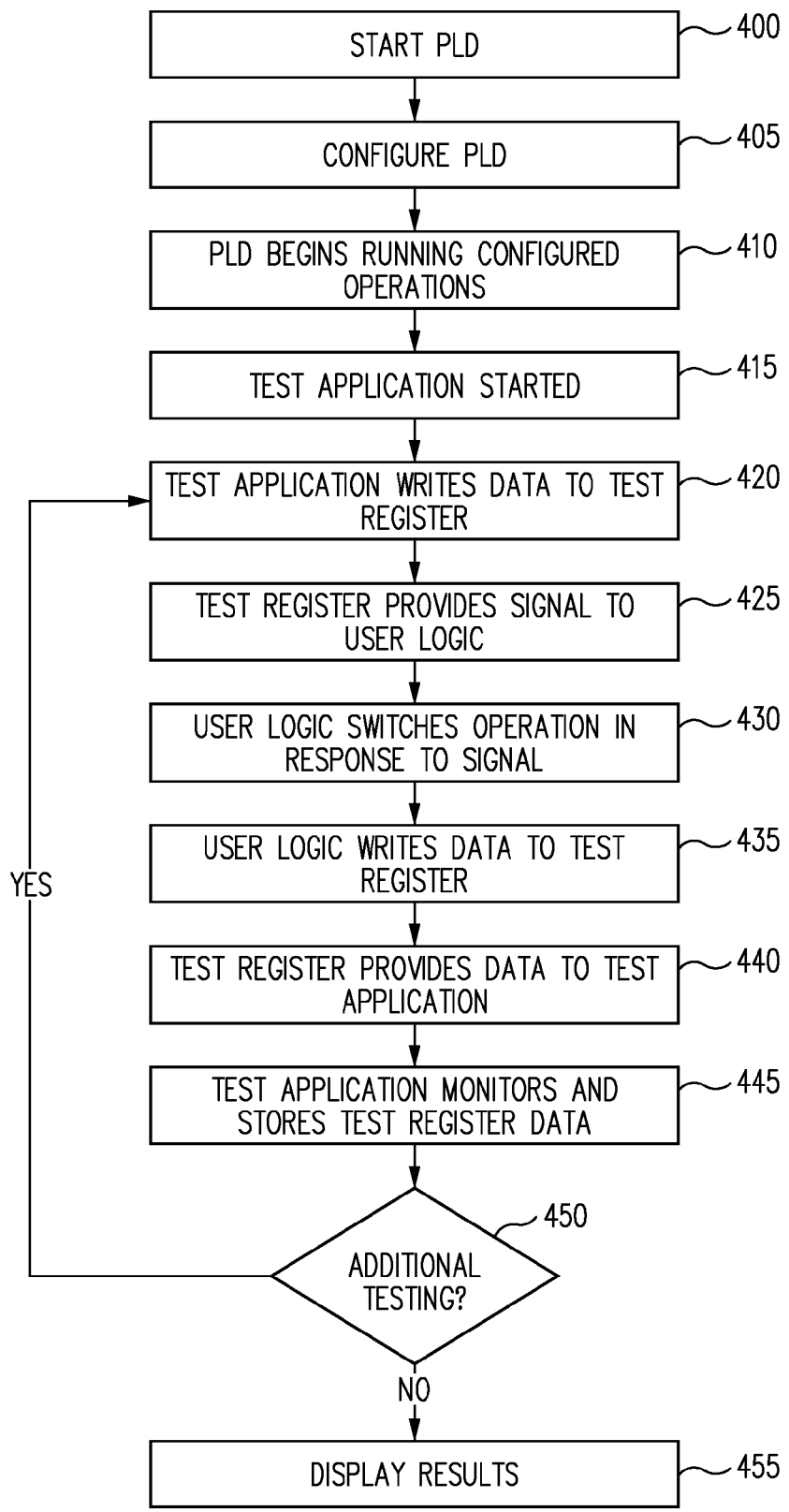
FIG. 4 illustrates a test process for a PLD in accordance with an embodiment of the disclosure.

FIG. 4 illustrates a test process for PLD 100 in accordance with an embodiment of the disclosure. In some embodiments, the process of FIG. 4 may be performed in operation 345 of FIG. 3.

In operation 400, PLD 100 is started. In some embodiments, this includes performing a power on reset (POR) operation in response to an external signal (e.g., received from system 130), a powering on of PLD 100, or other appropriate manner.

In operation 405, PLD 100 is configured with the configuration data previously stored in operation 340. In some embodiments, this includes loading the configuration data into appropriate volatile memory of PLD 100 to configure PLD 100 for use as discussed.

As also discussed, the configuration data configures PLD 100 to implement the user design 250 identified in operation 300, the test registers 252 identified in operation 305, and the debug core 210 identified in operation 310. In this regard, the configuration data configures PLD 100 to operate in accordance with the user design 250 and also support communication between system 130 and test registers 252 to selectively adjust the operation of the user design 250 and to monitor data received from the user design 250. In some embodiments, the debug core 210 implementation also supports such communication and monitoring between system 130 and SERDES block 150.

In operation 410, after the configuration data has been loaded, PLD 100 begins running the various configured operations. As part of its post-configuration operation, PLD 100 may initiate one or more signal transitions on a first external pin provided by I/O blocks 102. The first external pin may be connected to a second external pin provided by I/O blocks 102, thus permitting PLD 100 to detect that the configuration is complete (e.g., through configured logic blocks 104 in communication with the second external pin).

In operation 415, test application 192 starts running on external system 130. Operation 415 may be performed, for example, by a user interacting with external system 130, external system 130 responding to a signal provided by PLD 100, or another appropriate manner.

In operation 420, test application 192 writes data into one or more test registers 252. For example, in some embodiments, test application 192 issues a JTAG command that is passed over connections 140 through physical pins 101 to I/O block 102. I/O block 102 passes the JTAG command over JTAG bus 212 to translation logic block 220 which converts the JTAG command to a Wishbone command. Translation logic block 220 passes the Wishbone command over Wishbone bus 222 to translation logic block 230 which converts the Wishbone command to a register command. Translation logic block 230 passes the register command one of over register buses 232 to a particular test register 252 (e.g., identified by a particular address identified by system 130 in the original JTAG command). The configured user design 250 then writes the data into the identified test register 252.

In operation 425, the data written into the identified test register 252 is provided as one or more signals 253 to user logic 251 to control the realtime operation of the user logic 251 (e.g., to control multiplexers, switching logic, and/or other portions of user logic 251 to select between multiple alternative implementations of particular functionality as discussed).

In operation 430, user logic 251 switches operation in response to the one or more signals 253. In particular, user logic 251 may switch from operating in accordance with a current user logic implementation to an alternative user logic implementation. As a result, PLD 100 may exhibit different behavior in accordance with the alternative implementation selected by the data written into the identified test register 252.

In operation 435, user logic 251 writes data into one or more of test registers 252 (e.g., which may be the same or different than the test register written in operation 420) to be routed back to system 130 for realtime monitoring of internal PLD operations. The data written in operation 435 may be passed, for example, from user logic 251 and/or other portions of PLD to test registers 252 by signals 253. In some embodiments, such data may correspond to a signal value of user logic 251 that may be affected by the selection of an alternative user logic implementation (e.g., in response to the switched operation occurring in operation 430). Accordingly, the data may be used to monitor the status of operational changes occurring within user logic 251 as alternative user logic implementations are selected. In other embodiments, such data may correspond to any signal of PLD 100 to be monitored.

In operation 440, the test register 252 (written in operation 435) passes the written data back to external system 130. For example, in some embodiments, test register 252 passes the data over one or register busses 232 to translation logic block 230 which converts the data into a Wishbone data format. Translation logic block 230 passes the Wishbone data to translation logic block 220 which converts the data into a JTAG data format. Translation logic block 220 passes the JTAG data to system 130 through I/O block 102, external pins 101, and connections 140.

In operation 445, test application 192 monitors and stores the JTAG data corresponding to the test register data written by user logic 251. In operation 450, test application 192 determines whether additional testing is to be performed. For example, if additional alternative implementations remain to be tested and/or additional data remains to be monitored, then the process of FIG. 4 returns to operation 420. Otherwise, the process continues to operation 455.

In some embodiments, test application 192 may perform multiple iterations of operations 420 through 450, for example, in accordance with a script or other commands identified by the user and/or system 130 in previous operation 310. In this manner, many different implementations of user design 250 may be selectively tested by system 130 writing various data values into test registers 252. The resulting operations of PLD may be selectively monitored by system 130 as it receives data from test registers 252 in response to the execution of the different implementations by PLD 100.

In operation 455, test application 192 displays the data from test registers 252 written by PLD 100 to show the status of one or more corresponding internal signals of PLD 100 for review by user and/or further analysis performed by test application 192.

Although only a limited number of test registers 252 and data values have been discussed, any desired number of test registers 252 and data values may be used. For example, by providing access to thousands of possible test registers 252 (e.g., with associated addresses as discussed), large numbers (e.g., many thousands) of signals 253 may be selectively provided to adjust the operation of user logic 251 and/or to receive data from user logic 251 for testing (e.g., much greater numbers of switched data values and monitored signals may be utilized than are available according to prior DIP switching and light monitoring techniques).

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine-readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A machine-implemented method comprising:
receiving, from an external test application, a first data value at a programmable logic device (PLD) running configured user logic;
writing the first data value into a first test register of the PLD;
providing a control signal from the first test register to the configured user logic in response to the first data value;
switching operation of the configured user logic from a first test implementation to a second test implementation in response to the control signal;
writing a second data value into a second test register of the PLD, wherein the second data value is associated with an internal signal of the PLD; and
providing the second data value to the external test application.

2. The machine-implemented method of claim 1, wherein the internal signal is provided by the configured user logic in response to the switching of the configured user logic.

3. The machine-implemented method of claim 1, wherein the providing the second data value comprises routing the second data value from the second test register through a debug core of the PLD to an input/output (I/O) block of the PLD.

4. The machine-implemented method of claim 1, further comprising displaying, by the external test application, the second data value.

5. The machine-implemented method of claim 1, wherein the receiving comprises receiving the first data value at an input/output (I/O) block of the PLD, the method further comprising routing the received first data value from the I/O block through a debug core of the PLD to the first test register.

6. The machine-implemented method of claim 5, wherein the routing comprises converting the first data value from a first bus format to a second bus format.

7. The machine-implemented method of claim 1, further comprising:
generating first configuration data to configure the PLD in accordance with the user logic and the first test register;
wherein the receiving, the writing the first data, the providing the control signal, and the switching are performed to test the user logic; and
generating second configuration data to configure the PLD in accordance with the user logic without the first test register.

8. The machine-implemented method of claim 1, further comprising repeating the receiving, the writing the first data value, the providing the control signal, and the switching for a plurality of first data values and a plurality of first test registers, wherein each first test register is associated with an address referenced by the external test application.

9. The machine-implemented method of claim 1, wherein the method is performed in response to a script comprising one or more machine-readable instructions executed by the external test application.

10. A system comprising:
a programmable logic device (PLD) comprising:
an input/output (I/O) port configured to receive, from an external test application, a first data value;

configured user logic;
a first test register configured to store the received first data value and provide a control signal to the configured user logic in response to the first data value, wherein the user logic is configured to switch operation from a first test implementation to a second test implementation in response to the control signal; and
a second test register configured to store a second data value associated with an internal signal of the PLD wherein the I/O block is configured to provide the second data value to the external test application.

11. The system of claim 10, wherein the user logic is configured to provide the internal signal in response to the switching of the configured user logic.

12. The system of claim 10, wherein the PLD further comprises a debug core configured to route the second data value from the second test register to the I/O block.

13. The system of claim 10, further comprising an external device comprising:
a processor;
a display; and
a memory configured to store one or more machine-readable instructions which when executed by the processor are configured to run the external test application to provide the display with the second data value.

14. The system of claim 10, wherein the PLD further comprises a debug core configured to route the first data value from the I/O block to the first test register.

15. The system of claim 14, wherein the debug core is configured to convert the first data value from a first bus format to a second bus format.

16. The system of claim 10, further comprising an external device comprising:
a processor;
a display; and
a memory configured to store one or more machine-readable instructions which when executed by the processor are configured to cause the processor to:
generate first configuration data to configure the PLD in accordance with the user logic and the first test register to test the user logic; and
generate second configuration data to configure the PLD in accordance with the user logic without the first test register.

17. The system of claim 10, wherein the PLD comprises a plurality of first test registers configured to store a plurality of received first data values and provide a plurality of control signals to the configured user logic in response to the first data values, wherein each first test register is associated with an address referenced by the external test application.

18. The system of claim 10, further comprising an external device comprising:
a processor;
a display; and
a memory configured to store a script comprising one or more machine-readable instructions which when executed by the processor are configured to cause to processor to provide the first data value to the PLD.

* * * * *